(12) United States Patent
del Puerto et al.

(10) Patent No.: US 7,057,711 B2
(45) Date of Patent: *Jun. 6, 2006

(54) LITHOGRAPHY TOOL HAVING A VACUUM RETICLE LIBRARY COUPLED TO A VACUUM CHAMBER

(75) Inventors: Santiago del Puerto, Milton, NY (US); Markus F. A. Eurlings, Breda (NL)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/973,897

(22) Filed: Oct. 27, 2004

(65) Prior Publication Data

US 2005/0057740 A1   Mar. 17, 2005

Related U.S. Application Data

(63) Continuation of application No. 10/225,343, filed on Aug. 22, 2002, now Pat. No. 6,826,451, which is a continuation-in-part of application No. 10/206,400, filed on Jul. 29, 2002, now abandoned.

(51) Int. Cl.
*G06F 19/00* (2006.01)

(52) U.S. Cl. .................. 355/75; 700/246; 700/250; 700/257; 355/132; 414/217

(58) Field of Classification Search .............. 700/245, 700/246, 250, 257; 355/132, 75; 414/217; 716/21
See application file for complete search history.

(56) References Cited

U.S. PATENT DOCUMENTS

| | | |
|---|---|---|
| 4,536,458 A | 8/1985 | Ng |
| 4,563,085 A | 1/1986 | Ternes |
| 4,776,745 A | 10/1988 | Foley |
| 6,239,863 B1 | 5/2001 | Catey et al. |
| 6,404,483 B1 | 6/2002 | Segers et al. |
| 2002/0071105 A1 | 6/2002 | Miwa |
| 2002/0102564 A1 | 8/2002 | Mittmann et al. |

(Continued)

FOREIGN PATENT DOCUMENTS

EP   0 940 721 A2   9/1999

(Continued)

OTHER PUBLICATIONS

Mishima et al., Description characteristics of isopropanor (IPA) and moisture frim IPA vapor dried silicon wafers, 1989, IEEE, pp. 121-129.

(Continued)

*Primary Examiner*—Thomas G. Black
*Assistant Examiner*—McDieunel Marc
(74) *Attorney, Agent, or Firm*—Sterne, Kessler, Goldstein & Fox P.L.L.C

(57) ABSTRACT

A lithography tool includes an exposure chamber and a reticle handler that exchanges a reticle being exposed as prescribed by the user of the lithography tool. The reticle handler can include a vacuum-compatible robot, a vacuum chamber to house the robot, a load-lock to input reticles and transition them from atmospheric pressure to vacuum, a processing station for processing the reticle, and a reticle library for storing at least one extra reticle so that it is quickly available for exchange during an exposure process. The robot can have a two or more handed gripper to simultaneously hold multiple reticles. This allows a first reticle to be removed from the reticle stage with a first hand and a second reticle to be loaded onto the reticle stage with a second hand, and so on, which minimizes exchange time.

13 Claims, 9 Drawing Sheets

U.S. PATENT DOCUMENTS

| | | |
|---|---|---|
| 2002/0167649 A1 | 11/2002 | Heinle |
| 2002/0188417 A1 | 12/2002 | Levy et al. |
| 2003/0211409 A1 | 11/2003 | Nunes |
| 2005/0057740 A1* | 3/2005 | Del Puerto et al. ............ 355/75 |

FOREIGN PATENT DOCUMENTS

| | | |
|---|---|---|
| EP | 1052549 A2 | 11/2000 |
| EP | 1052551 A2 | 11/2000 |
| EP | 1211562 A1 | 6/2002 |
| EP | 1318430 A2 | 6/2003 |
| WO | WO 01/82055 A1 | 11/2001 |

OTHER PUBLICATIONS

Siniaguine, Atmopheric down stream plasma etching of Si wafers, 1998, IEEE, pp. 139-145.

Jimbo et al., Thermal desorption behavior of absorbed materials on wafer surfaces, 1997, IEEE, pp. E-5 to E-8.

Sugiyama et al., Advanced electron-beam lithography—Software system AMDES 1980, IEEE, 531-539.

English-language Patent Abstract of JP 2000228354 A, published Aug. 15, 2000, 1 page.

Copy of European Search Report for Singapore Appln. 200303900-5 mailed Feb. 26, 2004.

Tkisue et al., Development of non-contact handling system for semiconductor wafers 1989, IEEE, pp. 121-129.

Park, S. et al., "Assessment of Potential Gains in Productivity Due to Proactive Reticle Management Using Discrete Event Simulation," *Proceedings of the 1999 Winter Simulation Conference*, pp. 856-864 (1999).

European Search Report, from European Appl. No. 03017097.1, 4 pages, dated Aug. 3, 2005.

Abstract of JP-2000/228354, published Aug. 15, 2000.

* cited by examiner

LITHOGRAPHY TOOL HAVING A VACUUM RETICLE LIBRARY COUPLED TO A VACUUM CHAMBER

CROSS-REFERENCE TO RELATED APPLICATIONS

This application is a continuation of U.S. Ser. No. 10/225,343, filed Aug. 22, 2002(now U.S. Pat. No. 6,826,451 that issued Nov. 30, 2004), which is a continuation-in-part of U.S. Ser. No. 10/206,400, filed Jul. 29, 2002, now abandoned, which are incorporated by reference herein in their entireties.

BACKGROUND OF THE INVENTION

1. Field of the Invention

The present invention is related to a lithographic tool that increases multiple exposure throughput in ultra violet environments by switching multiple reticles during exposure.

2. Background Art

Lithography tools have been developed to allow smaller and smaller devices to be patterned on a wafer. Lithographic tools and methods are being developed that utilize multiple exposure. During multiple exposure, two or more reticles are imaged sequentially based on reticle swapping between imaging. Multiple exposure is particularly advantageous in extreme ultra violet (EUV) imaging to overcome undesirably low k1 imaging effects. In existing systems, the reticle swap time heavily impacts throughput because each reticle to be swapped must be transferred from ambient pressure to vacuum just before exposure. Unfortunately, there are no existing lithographic tools that perform multiple exposures and efficiently house multiple reticles at vacuum.

Therefore, what is needed is vacuum storage for holding two or more reticles, such that the vacuum storage is coupled to a vacuum chamber. This configuration would allow for fast reticle swap during multiple exposures, and hence throughput improvement.

BRIEF SUMMARY OF THE INVENTION

Embodiments of the present invention provide a method including the steps of processing reticles in a vacuum processing section received from a vacuum input section, storing the reticles in a vacuum library, storing data correlating information generated during the processing step and a location of each one of the reticles stored in the vacuum library, and retrieving a requested reticle to be used for exposing a pattern on a wafer from the vacuum library based on the storing data step.

Other embodiments of the present invention provide a method comprising the steps of providing a central vacuum section having a robot.

The method also includes the steps of coupling a vacuum input section to the central vacuum section, the vacuum input section receiving reticles before they are brought into the central vacuum section by the robot. The method also includes the steps of coupling a first vacuum holding section to the central vacuum section. The first vacuum holding section receives one reticle at a time from the robot. The method also includes coupling a second vacuum holding section to the central vacuum section via a valve. The second vacuum holding section simultaneously holding a predetermined amount of the reticles received through the valve from the robot. The method also includes coupling an exposure section to the central vacuum section. The exposure section receives reticles transported from one of the first or second vacuum holding section via the robot.

Still further embodiments of the present invention include a system including a central vacuum section and a robot positioned in the central vacuum section. The system also includes a pressure controlled input section that receives reticles before they are brought into the central vacuum section by the robot, a first holding section that holds one of the reticles at a time received from the robot, and a second holding section coupled to the central vacuum section that simultaneously holds a predetermined amount of the reticles received from the robot. The system also includes an exposure section that receives the reticles from the robot.

Still further embodiments of the present invention provide a method including the steps of indexing reticles before transferring the reticles to a vacuum input section, processing the reticles in a vacuum processing section that are received from the vacuum input section, storing the reticles in a vacuum library, indexing said stored reticles, and retrieving a requested reticle to be used for exposing a pattern on a wafer from the vacuum library based on said indexing steps.

Through the above embodiments, reticle swap time during multiple exposure is substantially reduced by having a plurality of reticles stored within the lithography tool at vacuum. This, in turn, decreases the costs of manufacturing semiconductors and solves imaging problems that occur in EUV environments.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1A, 1B, and 1C shows stages of components in a lithography tool according to embodiments of the present invention.

FIG. 2 is a flowchart depicting a method of switching reticles during exposure according to embodiments of the present invention.

FIGS. 3A, 3B, and 3C show views of a multiple reticle holding device in a lithography tool according to embodiments of the present invention.

Figure 1A:
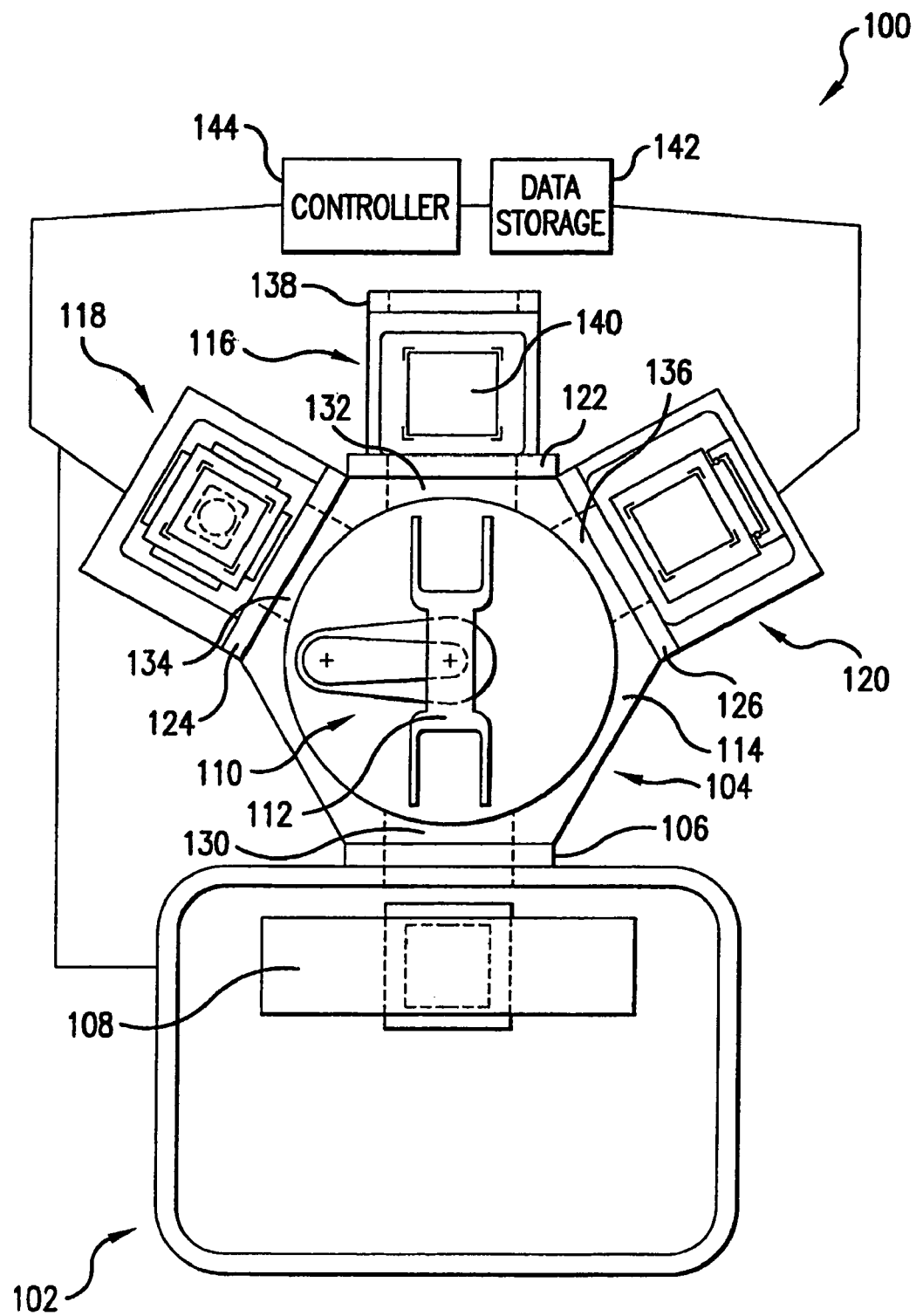

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Generally, a lithography tool 100 according to embodiments of the present invention can include an exposure chamber 102 with one or more mirrors (not shown) that project EUV light through a reticle mounted on a reticle stage 108 to a wafer (not shown) to print multiple copies of a layer of an integrated circuit on the wafer. Lithography tool 100 can also include a reticle handler 104 that exchanges the reticle being exposed as prescribed by the user of the lithography tool 100. Existing lithography tools that transport reticles for exposure are taught in U.S. Pat. No. 6,239,863 to Catey et al. and U.S. Pat. No. 6,619,903 to Friedman et al., U.S. app. Ser. No. 10/040,375 to Friedman et al., U.S. Prov. App. No. 60/358,354 to del Puerto et al., and U.S. Prov. App. No. 60/364,129 to del Puerto et al., which are all incorporated herein by reference in their entirety.

Specifically, the reticle handler according to embodiments of the present invention can include a vacuum-compatible robot 110, a vacuum chamber 114 (e.g., a central or main vacuum section) to house the robot 110, a pressure controlled input section (e.g., a load-lock) 116 to identify (or index) and input reticles and transition them from atmospheric pressure to vacuum, a first holding section (e.g., a processing station or section) 118 for identifying the reticle, inspecting the reticle, measuring the reticle's thickness, cleaning the reticle, and/or aligning the reticle relative to the lithography tool 100, and a second holding section (e.g., a reticle library) 120 for storing at least one extra reticle, such that the reticle is quickly available for exchange. Also, based on information gathered at input section 116, processing section 118 and/or the location of the reticle in reticle library 120, the stored reticle can be indexed to aid in retrieving the reticles during exposure. The robot 110 can have a one or more handed gripper 112 that can simultaneously hold one or more reticles. This allows a first reticle to be removed from the reticle stage 108 with a first hand and a second reticle to be loaded onto the reticle stage 108 with a second hand, and so on, which minimizes exchange time. Although discussed above and below as having one load lock, one processing section, and one exposure section, there can be as many of these elements as required.

Figure 1B:
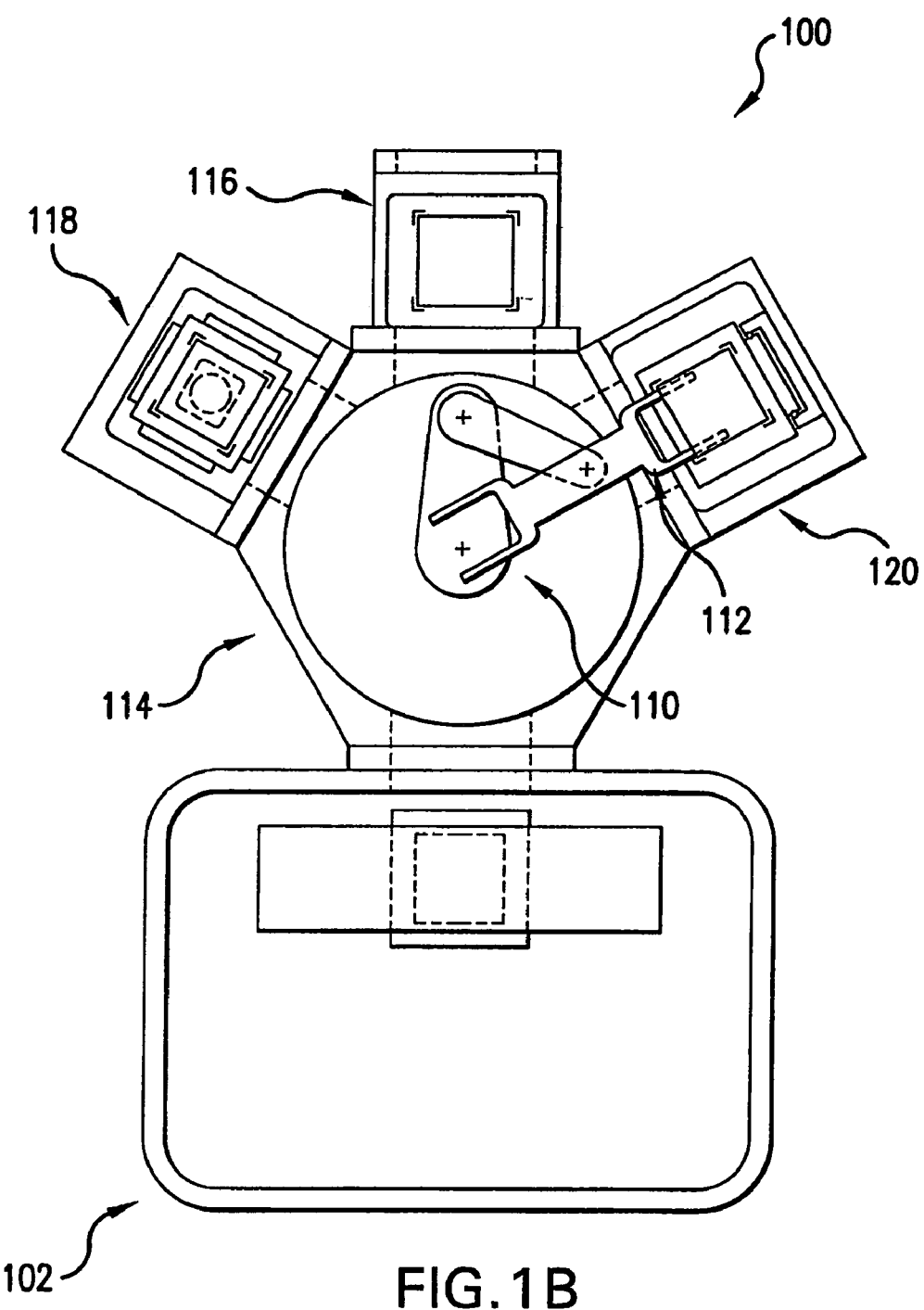
Figure 1C:
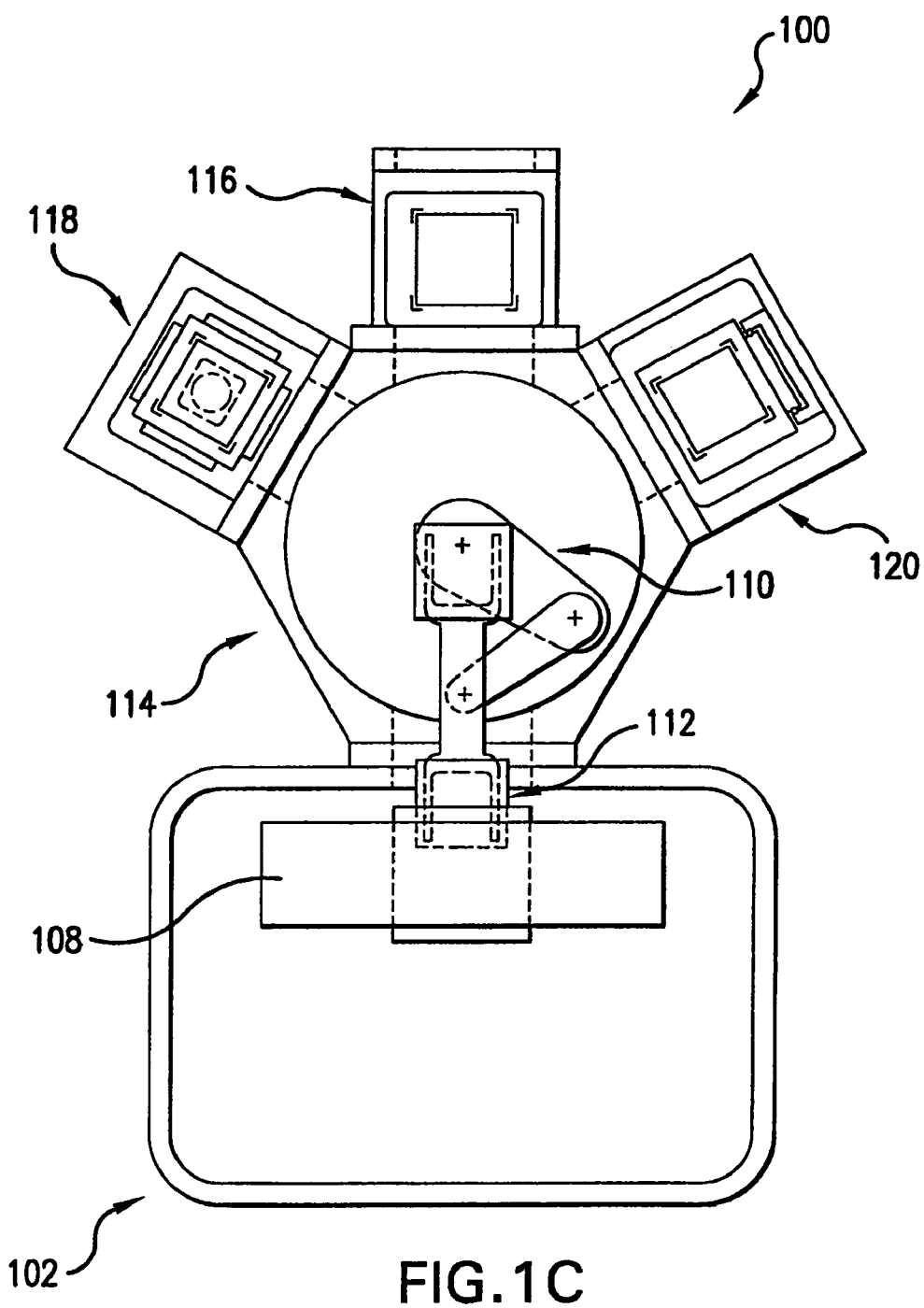

FIGS. 1A–C are sectional views looking into a lithography tool 100 from the top according to embodiments of the present invention. Only FIG. 1A is fully labeled with element numbers because FIGS. 1B and 1C only show different positions of a robot arm 110 during operation of lithography tool 100. Lithography tool 100 includes an exposure section (e.g. exposure chamber with one or more mirrors) 102 and reticle handler 104, which is coupled to exposure chamber 102 via a gate valve 106. A reticle stage 108 is located inside exposure chamber 102 and can hold a reticle that is being exposed near the location depicted as a dashed-line square.

With continuing reference to FIGS. 1A–C, reticle handler 102 includes a vacuum-compatible robot 110, which is shown as being equipped with two-handed gripper 112. In alternative embodiments, the gripper 112 can have as many hands as required. The robot 110 is located inside central vacuum chamber 114. Load-lock 116, processing station 118, and reticle library 120 are coupled to central chamber 114 via gate valves 122, 124, and 126, respectively. Load-lock 116 can include an identification device for identifying a reticle, as is known in the art. Processing station 118 can include: (1) an aligning device that can have a sensor (e.g., a camera, a reflective optical sensor, a through beam optical sensor, or the like), (2) an identification device (e.g., a camera, a bar code reader, or the like), (3) a reticle cleaning device, and/or (4) an inspection device (e.g., a measuring device, a camera, or the like) to measure thickness, read a bar code label on the reticle, or the like, as is known in the art. Mail-slot-like openings (e.g., passages) 130, 132, 134, and 136, respectively, represented by spaces between pairs of parallel dashed lines in walls of central chamber 114, allow robot 110 to pass reticles from one area of the tool 100 to another. Passage 130 connects exposure chamber 102 to central chamber 114. Passage 132 connects load-lock 116 to central chamber 114. Passage 134 connects processing station 118 to central chamber 114. Passage 136 connects reticle library 120 to central chamber 114. Each passage 130, 132, 134, and/or 136 can be closed and/or sealed off by closing its associated gate valve 106, 122, 124, and 126.

Again, with reference to FIGS. 1A–C, load-lock 116 further includes door valve 138. Through the use of gate valve 122 and door valve 138, load-lock 116 controls the pressure of reticles passed through it. Initially, gate valve 122 is closed and door valve 138 is open, thus enabling a reticle 140 to be removed from or placed in load-lock 116 through door valve 138. After placing reticle 140 in load-lock 116, door valve 138 is closed, load-lock 116 is pumped down, and gate valve 122 is opened. This allows robot 110 to reach reticle 140 through passage 132 and remove reticle 140 from load-lock 116. Reticle 140 is then processed in processing station 118, which is described in more detail below. After removing reticle 140 from processing station 118, robot 110 can store reticle 140 in reticle library 120 through slot 136, as shown in FIG. 1B. Data collected at the processing station 118 and information identifying the location of reticle 140 in reticle library 120 can be correlated and stored in data storage 142. Controller 144 accesses the stored data in data storage 142 when robot 110 is directed to retrieve requested reticles during an exposure process. Thus, through the system as described, there is a reticle library 120 located within the lithography tool 100 that holds multiple reticles at vacuum to allow for substantially faster reticle swap. Also, based on the correlated data in data storage 142 the lithography tool 100, the stored reticles can be indexed to increase the speed and accuracy in retrieving a requested reticle.

Figure 2:
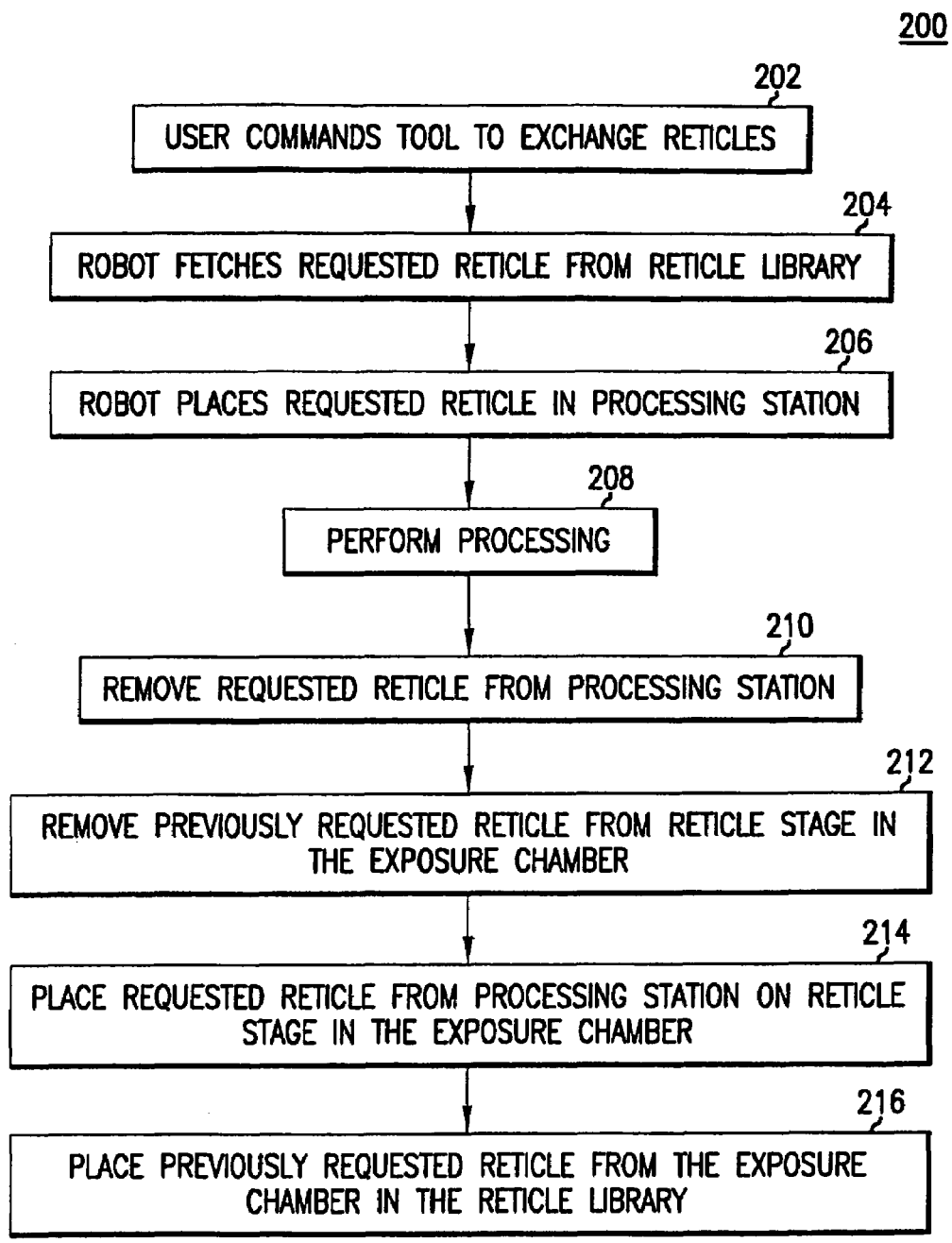

FIG. 2 shows a method 200 for exchanging reticles according to embodiments of the present invention (steps 202–216). At step 202, a user commands tool 100 to exchange reticles. At step 204, robot 110 fetches the requested reticle from reticle library 120 (FIG. 1B). At step 206, robot 110 places the requested reticle in processing station 118. At step 208, processing is performed. Processing can include a coarse or rough alignment on a mechanical stage or other rough alignment device in processing station 118. The mechanical stage has at least one degree of freedom selected from the group of X, Y, or Z translations and rotation about a Z-axis. The Z-axis is defined as being perpendicular to major faces or sides of the requested reticle. At step 210, robot 110 removes the requested reticle from processing station 118 with a first hand. At step 212, robot 110 removes a reticle that is currently on stage 108 with a second hand. At step 214, robot 110 places the requested reticle on stage 108 (FIG. 1C). At step 216, robot 110 places the reticle that was previously on stage 108 in reticle library 120 (FIG. 1B).

Existing vacuum systems have certain limitations: 1) commercially available vacuum-compatible robots tend to have very limited vertical travel; 2) commercial slot valves have openings that are very narrow in height; and 3) because of 1 and 2, the working volume accessible by a robot in a typical vacuum application is a very short and broad cylinder, for example, about 25 millimeters (mm) tall by 2,000 mm in diameter. Thus, according to embodiments of the present invention shown in FIGS. 3A–C, to increase the storage capacity, a reticle library 120 is implemented with a vertical indexer module 300. This increases the storage capacity of library 120 so that it can hold more than one reticle.

Figure 3A:
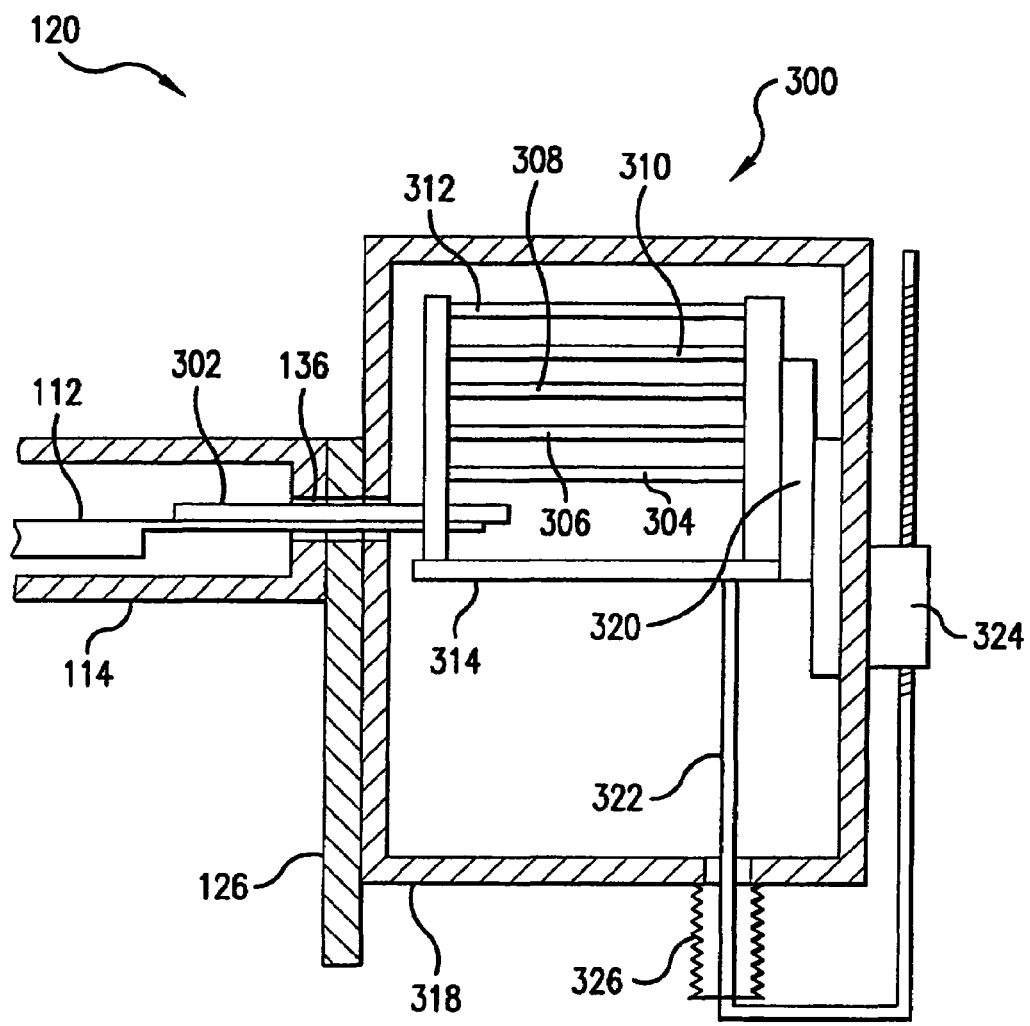
Figure 3B:
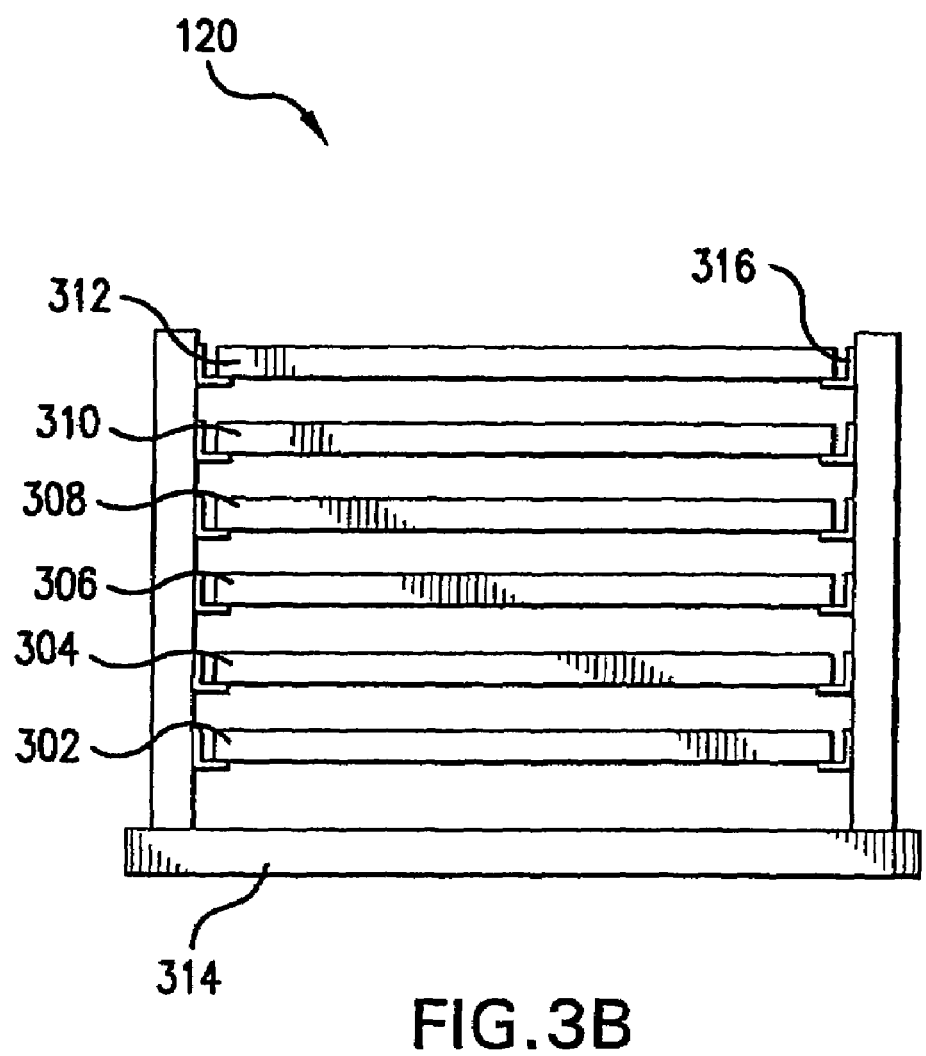
Figure 3C:
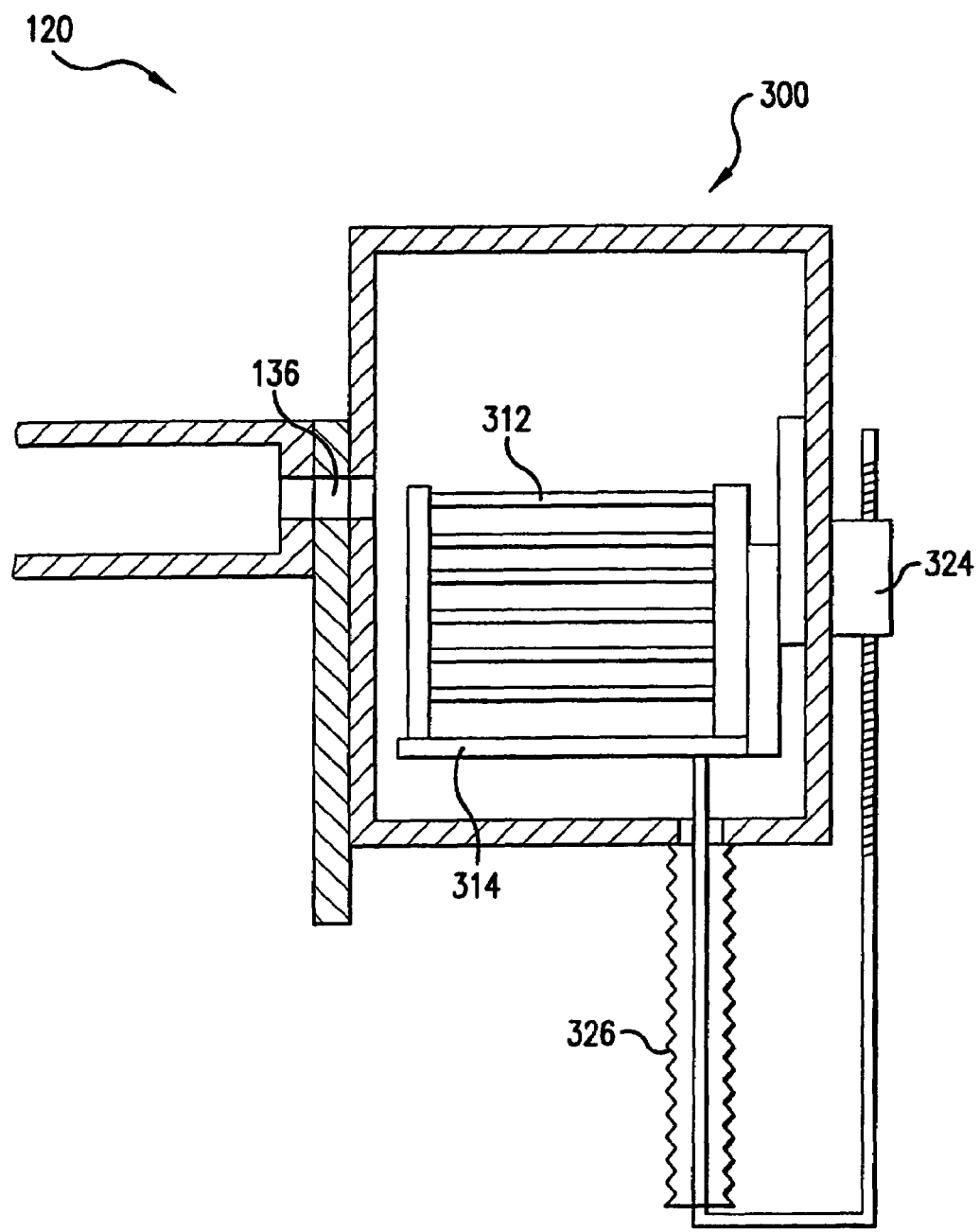

FIGS. 3A–3C show side cross-sectional views of an indexer module 300 according to embodiments of the present invention. Indexer module 300 is part of reticle library 120 and is coupled via gate valve 126 to central vacuum chamber 114. Gripper 112 is shown transporting reticle 302 from indexer module 300 to central vacuum chamber 114 via passage 136. Other reticles 304–312 are shown as being stored inside indexer module 300. Rack 314 supports reticles 304–312.

Referring to FIG. 3B, which shows a side view of rack 314, (as seen from the approach direction of robot 110), each reticle 302–312 is supported by brackets 316, which allow removal of reticles 302–312 in the direction perpendicular to this view.

Referring again to FIG. 3A, rack 314 is coupled to library vacuum enclosure 318 via slide 320. Rack 314 is raised or lowered relative to the enclosure 318 by the action of push rod 322, which is powered by ball screw drive 324. Raising or lowering rack 314 can line up any of the reticles 302–312 to passage 136. This allows for easy insertion or extraction of the reticles 302–312 from reticle library 120 by robot 110. Comparing FIGS. 3A and 3C, rack 314 is at an upper limit of its travel in FIG. 3A, corresponding to the bottom reticle slot that holds reticle 302 being lined up to passage 136 making reticle 302 accessible by robot 110. In contrast, in FIG. 3C rack 314 is at a lower limit of its travel, which corresponds to the top reticle slot that holds reticle 312 being lined up to passage 136 making the reticle 312 accessible by robot 110. Bellow 326 is attached at one end to vacuum enclosure 318 and at an opposite end to push rod 322. Bellow 326 is used to maintain the vacuum seal, while accommodating the motion of the push rod 322. Bellow 326 is shown in its most contracted position in FIG. 3A and in its most extended position in FIG. 3C.

Figure 4:
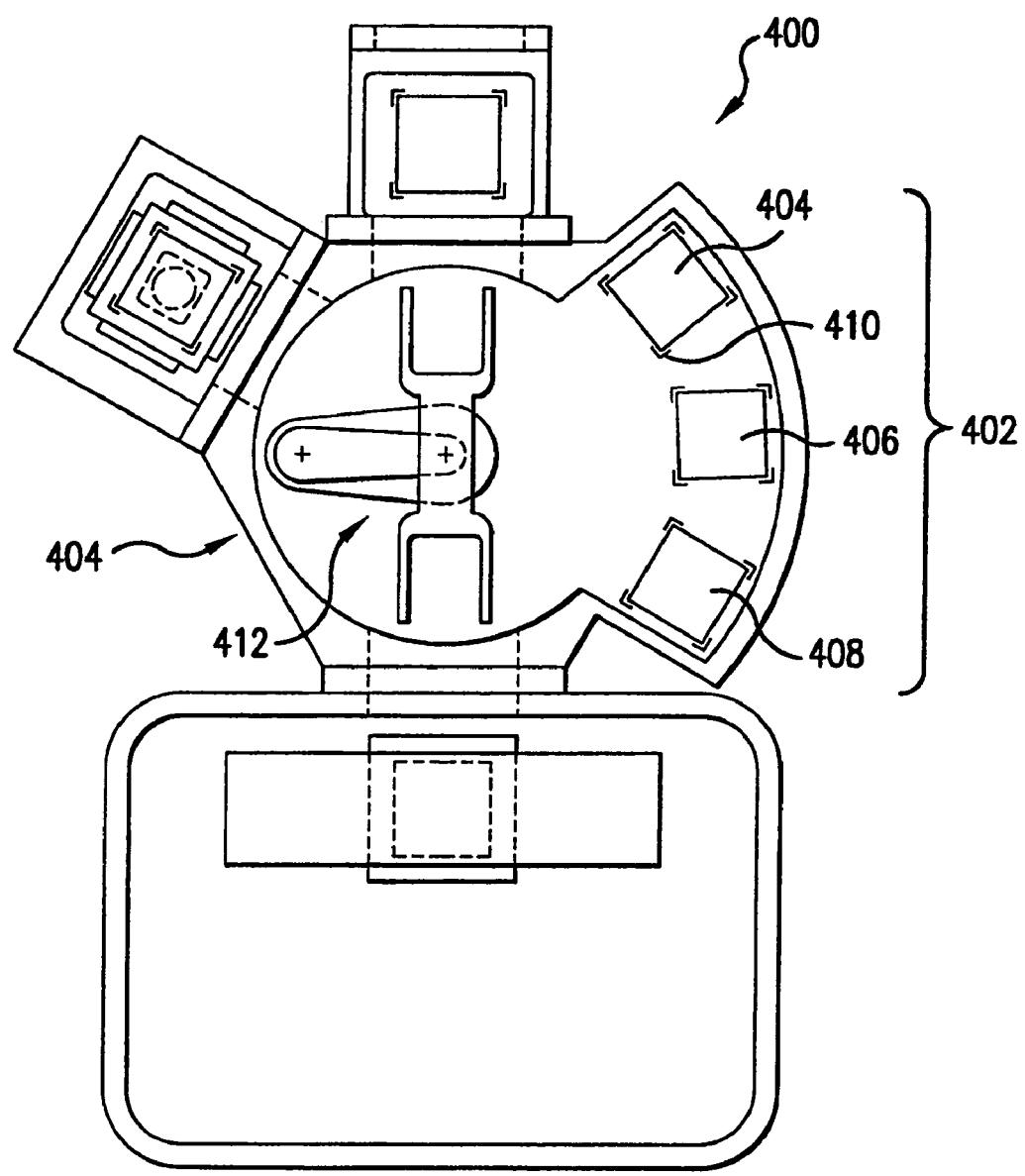
FIG. 4 shows a multiple reticle holding device in a lithography tool according to embodiments of the present invention.

FIG. 4 shows a lithography tool 400 including an in-vacuum library 402 according to embodiments of the present invention. Central vacuum chamber 404 has been extended to incorporate library area 402. Reticle positions 404, 406, and 408 in library area 402 and have support devices 410 (e.g., brackets) to hold stored reticles. In some embodiments, reticles are only about 6 mm thick, but the typical vertical motion range of a vacuum robot 412 is in the order of 25 mm or slightly more. Thus, the vertical motion range of robot 412 is greater than the thickness of one reticle. Accordingly, in alternative embodiments, more than one reticle can be vertically stacked in each of reticle positions 404, 406, and/or 408. This increases the capacity of library 402. A rack (not shown) similar to rack 408 in FIG. 3B, but shorter (e.g., two levels tall) could be used to support the reticles.

Figure 5:
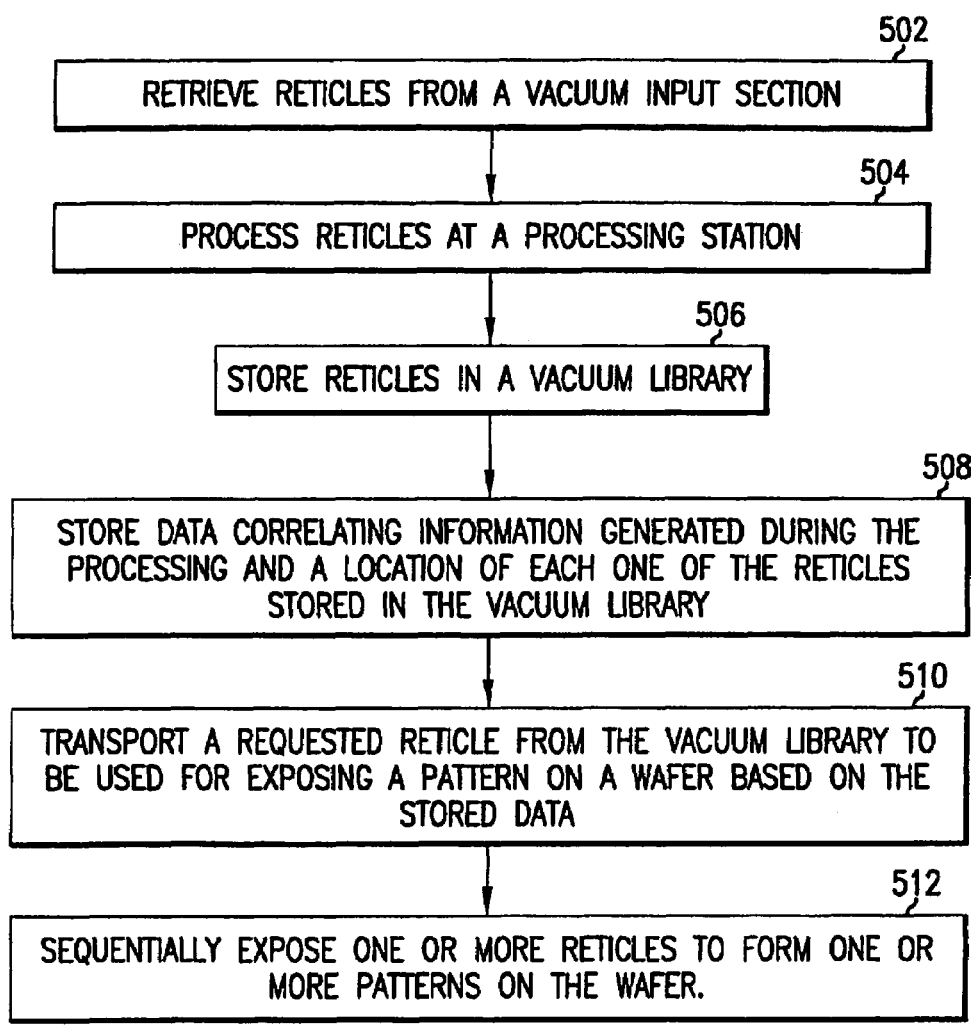
FIG. 5 is a flowchart depicting a method according to embodiments of the present invention.

FIG. 5 illustrates a method 500 according to embodiments of the present invention (steps 502–512). At step 502, reticles are retrieved from a vacuum input section (e.g., section 116) that transitions the reticles from atmospheric pressure to vacuum. Additionally, at before or at step 502, the reticle can be identified or indexed. At step 504, a processing section (e.g., section 118) processes reticles, which is described in more detail below. At step 506, the reticles are stored in a vacuum library (e.g., library 120 or library 402). At step 508, data is stored (e.g., in data storage 142). The data is representative of a correlation between information generated during processing step 504 and/or identification information generated before or during step 502 and information identifying a location of each one of the reticles stored in the vacuum library. At step 510, a requested reticle is transported from the vacuum library to an exposure chamber (e.g., chamber 102) based on the stored data (e.g., under control of controller 144). In other embodiments, during transporting step 510 a robot (e.g., robot 110 or robot 412) with multiple holding devices (e.g., holding devices 112) can be used to transport more than one requested reticle to allow for sequential exposure of more than one pattern on the wafer. In still further embodiments, step 510 can include pre-aligning the requested reticle at the processing section before delivering the reticle to the exposure chamber. At step 512, one or more reticles are sequentially exposed on a reticle stage (e.g., stage 108) in the exposure chamber to form one or more patterns on the wafer.

In various embodiments, the processing step 504 can include one or more processes. A first process can be identifying each one of the reticles. The identifying can be accomplished with a camera, a bar code reader, or the like. Another process can be inspecting each one of the reticles with an appropriate inspection device. A further process can be measuring a thickness of each one of the reticles. A still further process can be rough-aligning the reticles with respect to a lithography tool. A still further process can be cleaning the reticles. Accordingly, the data stored in step 508 is partially based on one or more of these processes.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:

means for processing reticles received from a vacuum input section, the means for processing having a vacuum environment;

means for storing the reticles having a vacuum environment;

means for indexing the stored reticles; and means for retrieving a requested reticle from the means for storing using information from the means for indexing, the requested reticle to be used during an exposure operation.

2. The system of claim 1, wherein the means for processing comprises:

means for identifying each one of the reticles, wherein data stored in the means for indexing includes an identification determined using the means for identifying.

3. The system of claim 1, wherein the means for processing comprises:

means for inspecting each one of the reticles, wherein data stored using the means for indexing includes inspection information determined using the means for inspection.

4. The system of claim 1, wherein the means for processing comprises:
    means for measuring a thickness of each one of the reticles, wherein data stored using the means for indexing includes the thickness determined using the means for measuring.

5. The system of claim 1, wherein the means for processing comprises:
    means for cleaning the reticle.

6. The system of claim 1, wherein the means for processing comprises:
    means for rough-aligning the reticles with respect to a lithography tool.

7. The system of claim 1, wherein the means for processing comprises at least one of:
    means for identifying the reticles;
    means for inspecting the reticles;
    means for measuring a thickness of the reticles;
    means for cleaning the reticles; and
    means for rough-aligning the reticles.

8. The system of claim 1, wherein the means for retrieving comprises:
    a robot with multiple holding devices that retrieves the requested reticle.

9. The system of claim 8, wherein more than one requested reticle is retrieved by the robot to allow for exposure of more than one pattern.

10. The system of claim 1, further comprising: means for transitioning the reticles from atmospheric pressure to vacuum in the input section.

11. The system of claim 1, further comprising: means for pre-aligning the requested reticle before the exposure operation.

12. The system of claim 1, wherein the means for indexing comprises:
    means for storing data correlating information generated using the means for processing and a location of each one of the reticles stored in the means for storing.

13. The system of claim 1, wherein the vacuum input section comprises:
    means for capturing information about the reticle, wherein data stored in the means for indexing includes captured information determined using the means for capturing information.

* * * * *